(12) United States Patent
Choi et al.

(10) Patent No.: US 12,113,032 B2
(45) Date of Patent: Oct. 8, 2024

(54) SUBSTRATE HAVING UNDERCUT PORTION FOR STRESS MITIGATION

(71) Applicant: Avago Technologies International Sales Pte. Limited, Singapore (SG)

(72) Inventors: YongIk Choi, Seoul (KR); Chris Chung, Seoul (KR); Michael Leary, Sunnyvale, CA (US); Domingo Figueredo, Jacksonville, FL (US); Chang Kyu Choi, Fremont, CA (US); Sarah Haney, San Jose, CA (US); Li Sun, San Jose, CA (US)

(73) Assignee: Avago Technologies International Sales Pte. Limited, Singapore (SG)

( * ) Notice: Subject to any disclaimer, the term of this patent is extended or adjusted under 35 U.S.C. 154(b) by 348 days.

(21) Appl. No.: 17/667,645

(22) Filed: Feb. 9, 2022

(65) Prior Publication Data

US 2022/0165685 A1     May 26, 2022

Related U.S. Application Data

(62) Division of application No. 16/670,564, filed on Oct. 31, 2019, now Pat. No. 11,276,650.

(51) Int. Cl.
*H01L 23/00*     (2006.01)
*H01L 21/48*     (2006.01)
(Continued)

(52) U.S. Cl.
CPC ........ *H01L 23/562* (2013.01); *H01L 21/4857* (2013.01); *H01L 23/13* (2013.01);
(Continued)

(58) Field of Classification Search
CPC ... H01L 23/563; H01L 21/4857; H01L 23/13; H01L 23/49816; H01L 23/49822; H01L 23/49838
See application file for complete search history.

(56) References Cited

U.S. PATENT DOCUMENTS

| | | | |
|---|---|---|---|
| 10,535,590 B2 | 1/2020 | Rosch | |
| 2007/0201193 A1* | 8/2007 | Tsuji | ................... H05K 3/3452 257/E21.503 |

(Continued)

FOREIGN PATENT DOCUMENTS

CN     106030786 A     10/2016

OTHER PUBLICATIONS

Chinese office action on CN 202010744044.0 dated Aug. 24, 2022.
(Continued)

*Primary Examiner* — Michael Jung
(74) *Attorney, Agent, or Firm* — Foley & Lardner LLP

(57) ABSTRACT

A device and substrate are disclosed. An illustrative device includes a substrate having a first surface and an opposing second surface, a solder material receiving curved surface exposed at the second surface of the substrate, a solder resist material that at least partially covers the solder material receiving curved surface such that a middle portion of the solder receiving curved surface is exposed and such that an edge portion of the solder material receiving curved surface is covered by the solder resist material and forms an undercut, and a solder material disposed within the solder material receiving curved surface and within the undercut.

20 Claims, 17 Drawing Sheets

(51) Int. Cl.
    *H01L 23/13*     (2006.01)
    *H01L 23/498*     (2006.01)

(52) U.S. Cl.
    CPC .. *H01L 23/49816* (2013.01); *H01L 23/49822* (2013.01); *H01L 23/49838* (2013.01)

(56) References Cited

U.S. PATENT DOCUMENTS

| | | |
|---|---|---|
| 2009/0114431 A1 | 5/2009 | Kuroda et al. |
| 2015/0279817 A1 | 10/2015 | Zhang et al. |
| 2019/0181087 A1 | 6/2019 | Dandia et al. |
| 2019/0206774 A1 | 7/2019 | Rosch |
| 2020/0328151 A1 | 10/2020 | Sir et al. |
| 2021/0035818 A1* | 2/2021 | Ibrahim ................ H01L 21/481 |

OTHER PUBLICATIONS

Non-Final Office Action on U.S. Appl. No. 16/670,564 dated Jun. 16, 2021 (8 pages).

U.S. Notice of Allowance on U.S. Appl. No. 16/670,564 dated Nov. 8, 2021 (5 pages).

\* cited by examiner

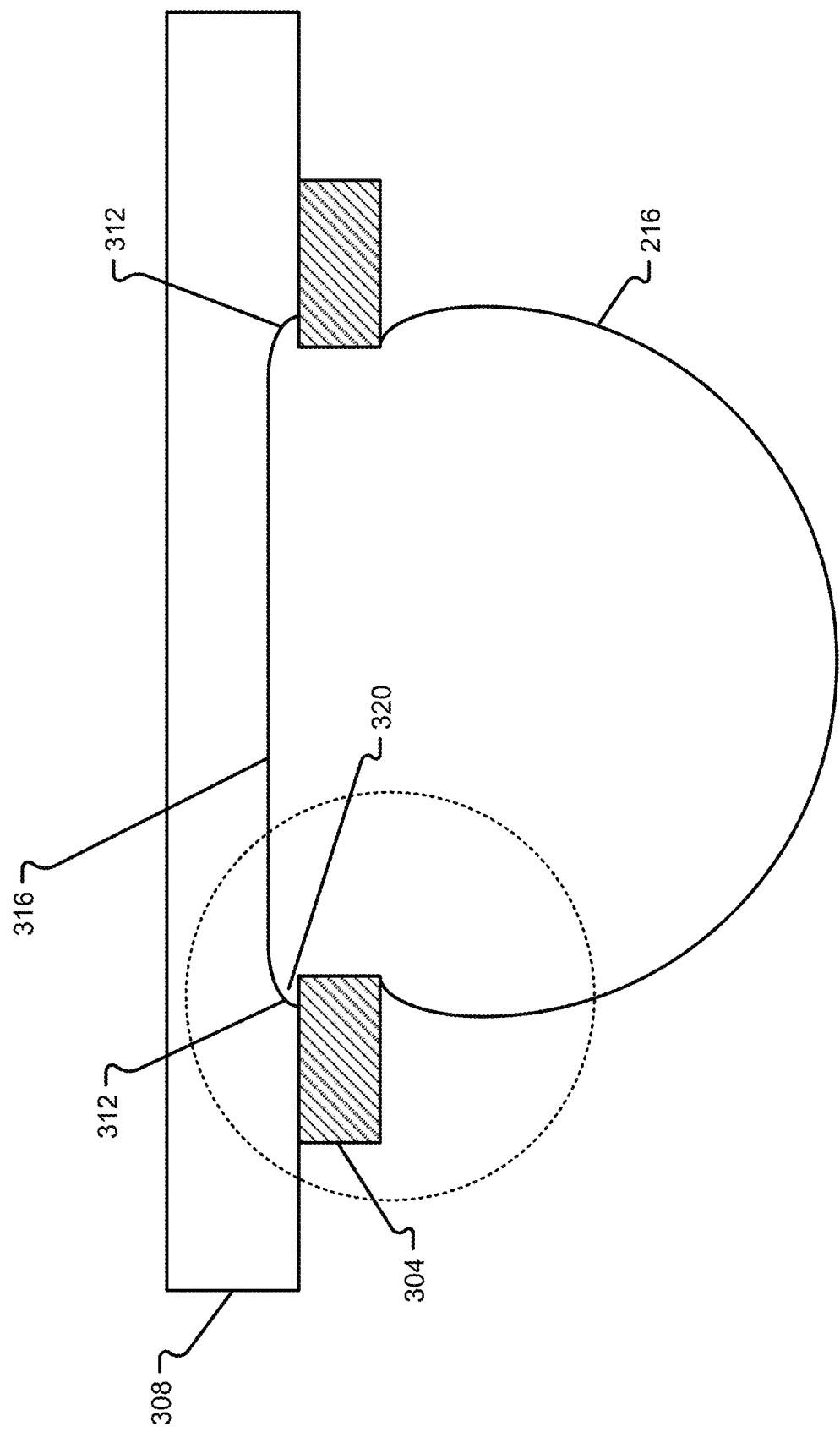

US 12,113,032 B2

SUBSTRATE HAVING UNDERCUT PORTION FOR STRESS MITIGATION

CROSS-REFERENCE TO RELATED APPLICATIONS

This application claims the benefit of and priority under 35 U.S.C. § 120 to U.S. Non-Provisional patent application Ser. No. 16/670,564, filed Oct. 31, 2019, titled "STRESS MITIGATION STRUCTURE," which is incorporated by reference in its entirety for all purposes.

FIELD OF THE DISCLOSURE

Example embodiments are generally directed toward structures used to mitigate solder cracks induced by external forces.

BACKGROUND

Semiconductor packages with electronic components are common for operating compact consumer devices such as mobile phones, personal computer, tablets, etc. Many packages often include a substrate having both passive circuit components and active circuit components, such as Integrated Circuit (IC) chips, connected thereto. The substrate is often connectable to a larger circuit board via one or a series solder balls. The solder balls, especially at edges and corners of the substrate, are subject to stress-induced cracks when exposed to external forces such as high-gravitational forces imparted when dropped.

BRIEF DESCRIPTION OF THE DRAWINGS

Inventive concepts are described in conjunction with the appended figures, which are not necessarily drawn to scale:

FIG. 3A is a first cross-sectional view of a solder material receiving curved surface in accordance with embodiments of the present disclosure;

DETAILED DESCRIPTION

Figure 1:
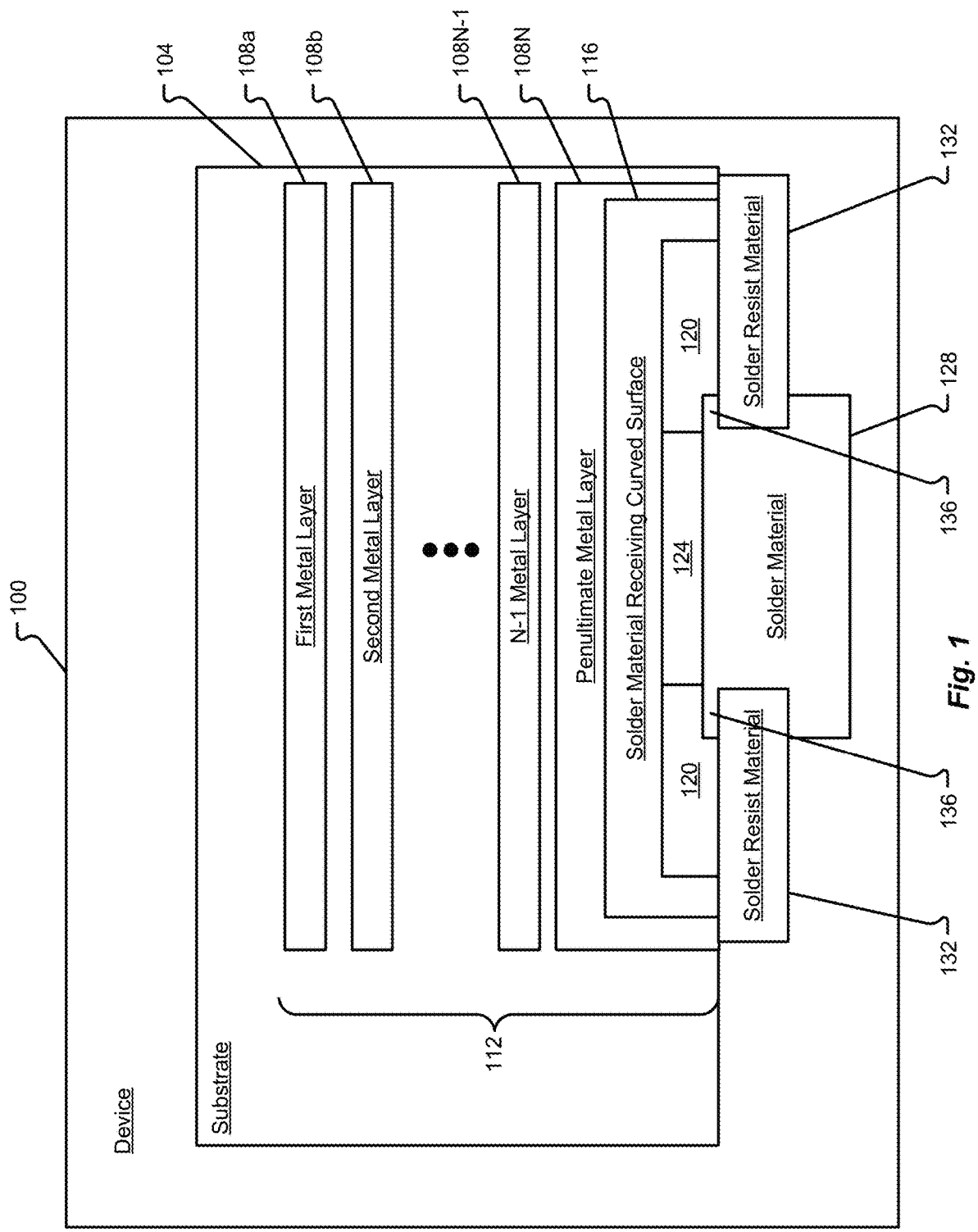
FIG. 1 is a block diagram depicting a device in accordance with at least some embodiments of the present disclosure.

The above-noted shortcomings associated with traditional solder balls and packages including solder balls are addressed by embodiments of the present disclosure. Size reduction of all components being used inside electronic devices (e.g., smartphones, tablets, wearables, etc.) has become the new imperative. Size reduction of packages and components provided in an electronic device can be accomplished by placing some of the IC chips and passive circuit components on the back side of the package. This type of configuration reduces the number of solder balls on the back side of the package, making the package more susceptible to damage induced by mechanical shock. This susceptibility is increased primarily because there are fewer solder balls available to handle the same mechanical shock forces as the previous package. Thus, similar forces are being placed on a fewer number of solder balls, thereby concentrating the forces through the solder balls.

Traditionally solder balls are designed such that stress concentration points exist where the solder ball interfaces with a Printed Circuit Board (PCB), a metal trace of a PCB, and/or a solder pad of a PCB. The stress concentration point is often created because of the shape taken by the solder material during deposition or attachment of the solder material to the PCB, metal trace, and/or solder pad. The natural shape taken by the solder material creates a relatively "sharp" angle (e.g., a nearly orthogonal angle) at the interface between the solder material and the PCB. This becomes a point of failure in a package having fewer solder balls that previous packages.

Embodiments of the present disclosure solve these and other challenges. Specifically, in some embodiments, a solder material receiving curved surface is disclosed along with a solder resist that at least partially covers the solder material receiving curved surface. The combination of the curved surface and proper placement of the solder resist relative to the curved surface may create an undercut between the solder resist and the solder material receiving curved surface. When solder material is deposited onto the solder material receiving curved surface (e.g., during solder reflow), a curved transition is created between the solder material and the solder material receiving curved surface. The curved transition is less likely than an orthogonal transition to concentrate forces or stresses under extreme gravitational force situations (e.g., when the electronic device is dropped and hits the ground). In other words, the curved transition helps to distribute forces across a larger amount of solder material, thereby relieving the solder material of stress concentrations, which could otherwise lead to failures or cracks in the solder material.

The ensuing description provides embodiments only, and is not intended to limit the scope, applicability, or configuration of the claims. Rather, the ensuing description will provide those skilled in the art with an enabling description for implementing the described embodiments. It being understood that various changes may be made in the function and arrangement of elements without departing from the spirit and scope of the appended claims.

Various aspects of example embodiments will be described herein with reference to drawings that are schematic illustrations of idealized configurations. As such, variations from the shapes of the illustrations as a result, for example, manufacturing techniques and/or tolerances, are to be expected. Thus, the various aspects of example embodiments presented throughout this document should not be construed as limited to the particular shapes of elements (e.g., regions, layers, sections, substrates, etc.) illustrated and described herein but are to include deviations in shapes that result, for example, from manufacturing. By way of example, an element illustrated or described as a rectangle may have rounded or curved features and/or a gradient concentration at its edges rather than a discrete change from one element to another. Thus, the elements illustrated in the drawings are schematic in nature and their shapes are not intended to illustrate the precise shape of an element and are not intended to limit the scope of example embodiments.

It will be understood that when an element such as a region, layer, section, substrate, or the like, is referred to as being "on" another element, it can be directly on the other element or intervening elements may also be present. In contrast, when an element is referred to as being "directly on" another element, there are no intervening elements present. It will be further understood that when an element is referred to as being "formed" or "established" on another element, it can be grown, deposited, etched, attached, connected, coupled, or otherwise prepared or fabricated on the other element or an intervening element.

Furthermore, relative terms, such as "lower" or "bottom" and "upper" or "top" may be used herein to describe one element's relationship to another element as illustrated in the drawings. It will be understood that relative terms are intended to encompass different orientations of an apparatus in addition to the orientation depicted in the drawings. By way of example, if an apparatus in the drawings is turned over, elements described as being on the "lower" side of other elements would then be oriented on the "upper" side of the other elements. The term "lower" can, therefore, encompass both an orientation of "lower" and "upper" depending of the particular orientation of the apparatus. Similarly, if an apparatus in the drawing is turned over, elements described as "below" or "beneath" other elements would then be oriented "above" the other elements. The terms "below" or "beneath" can therefore encompass both an orientation of above and below.

The phrases "at least one," "one or more," "or," and "and/or" are open-ended expressions that are both conjunctive and disjunctive in operation. For example, each of the expressions "at least one of A, B and C," "at least one of A, B, or C," "one or more of A, B, and C," "one or more of A, B, or C," "A, B, and/or C," and "A, B, or C" means A alone, B alone, C alone, A and B together, A and C together, B and C together, or A, B and C together.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and this disclosure.

As used herein, the singular forms "a," "an," and "the" are intended to include the plural forms as well, unless the context clearly indicates otherwise. It will be further understood that the terms "include," "includes," 'including," "comprise," "comprises," and/or "comprising," when used in this specification, specify the presence of stated features, integers, steps, operations, elements, and/or components, but do not preclude the presence or addition of one or more other features, integers, steps, operations, elements, components, and/or groups thereof. The term "and/or" includes any and all combinations of one or more of the associated listed items.

Referring initially to FIG. 1, additional details of a device 100 having a substrate 104 configured to distribute forces imparted on interfaces between a solder material 128 and the substrate 104 will be described in accordance with at least some embodiments of the present disclosure. The illustrative device 100 may correspond to any type of electronic device and may include one or many substrates 104 as described herein. In some embodiments, the device 100 corresponds to an electronic device such as a smartphone, tablet, wearable device, laptop, or any other consumer electronic device.

The substrate 104 is shown to include a plurality of metal layers 112 that include a first metal layer 108*a*, a second metal layer 108*b*, an N−1th metal layer 108N−1, and an Nth metal layer or penultimate metal layer 108N. Each of the metal layers in the plurality of metal layers 112 may be physically and electrically connected with one another. In some embodiments, each of the metal layers in the plurality of metal layers 112 form a vertical stack of interconnect structures that are substantially aligned with one another. It should be appreciated that the number of metal layers in the plurality of metal layers 112 may include two, three, four, . . . , twenty, or more metal layers without departing from the scope of the present disclosure. In some embodiments, the plurality of metal layers 112 are configured to carry an electrical current from one surface of the substrate 104 to the opposing surface of the substrate 104.

In some embodiments, the penultimate metal layer 108N is exposed at a bottom surface of the substrate 104. As such, the penultimate metal layer 108N may include a solder material receiving surface. In some embodiments, the penultimate metal layer 108N includes a solder material receiving curved surface 116 that is physically and electrically connected to the plurality of metal layers 112 (e.g., the vertical stack of interconnect structures disposed within the substrate 104). The penultimate metal layer 108N may comprise a metal trace, a solder pad, or the like that is configured to receive a solder material 128 via the solder material receiving curved surface 116.

The solder material receiving curved surface 116 may include an edge portion 120 that surrounds (partially or completely) a middle portion 124. Although not depicted, the size and shape of the edge portion 120 may depend upon the size and shape of the middle portion 124. In some embodiments, the solder material receiving curved surface 108N may include a substantially circular, elliptical, or ovoid shape and the edge portion 120 may be substantially ring shaped and configured to circumnavigate the middle portion 124, which may also be substantially circular, elliptical, or ovoid shaped. In some embodiments, the middle portion 124 may be substantially polygonal (e.g., having one or more straight sides) and the edge portion 120 may correspond to a border of the middle portion 124, meaning that the edge portion 120 may have substantially the same shape as the middle portion 124, but may extend around a perimeter of the middle portion 124. In some embodiments, an area of the edge portion 120 is no more than ¼ an entire area of the solder material receiving curved surface 116.

In some embodiments, the middle portion 124 may be substantially planar or flat. Alternatively or additionally, at least some of the middle portion 124 may be substantially planar or flat (e.g., parallel with but offset from the plane of the bottom surface of the substrate 104). The middle portion 124 may transition into the edge portion 120, which exhibits at least some curvature, thereby providing the curvature to the solder material receiving curved surface 116. Accordingly, in some embodiments, the edge portion 120 may have a substantial curvature when viewed cross-sectionally whereas the middle portion 124 may be substantially planar or flat. Accordingly, the edge portion 120 of the solder material receiving curved surface 116 may exhibit a height from the bottom surface of the substrate 104 to the middle portion 124 because of the curvature provided in the edge portion 120.

FIG. 1 further illustrates that solder resist material 132 may be provided over some or all of the edge portion 120 of the solder material receiving curved surface 116. In other words, a solder resist material 132 may be provided over a portion of the bottom surface of the substrate 104 and over some or all of the edge portion 120. Because the edge portion 120 may exhibit a height due to its curvature, an undercut 136 may be established between the solder resist material 132 and the edge portion 120 of the solder material receiving curved surface 116. In some embodiments, the undercut 136 may be formed via an etching process (e.g., chemical etching), via a mechanical grinding process, via a layer deposition process, or some combination thereof. In some embodiments, the solder resist material 132 may include any traditional type of material known to prevent solder from reflowing. Non-limiting examples of materials that may be used for the solder resist material 132 include Ti, TiW, epoxy liquids, dry liquid inks, or any other material capable of preventing solder reflow outside the area bound by the solder resist material 132.

In some embodiments, the undercut 136 established between the solder resist material 132 and the edge portion 120 of the solder material receiving curved surface 116 may be configured to receive and hold solder material 128 during establishment of a solder ball with the solder material 128. In some embodiments, the undercut 136 receives an amount of solder material 128 sufficient to create an anchor effect for the solder material 128 between the solder material receiving curved surface 116 and the solder resist material 132. In some embodiments, the solder material 128 residing in the undercut 136 may adopt a shape of the undercut 136. As a non-limiting example, the solder material 128 disposed within the undercut 136 may define a mushroom-shaped interlocking structure. This interlocking structure may help to ensure a suitable physical connection between the solder material 128 and the solder material receiving curved surface 116. The interlocking structure may also help to relieve or better distribute high-G forces (e.g., at least 100G) imparted on the solder material 128 should the device 100 be dropped and hit the ground or some other hard object if the device 100 falls approximately 4 feet and impacts a substantially hard surface. Specifically, a mushroom-shaped interlocking structure may eliminate the orthogonal angles traditionally created between the solder material 128 and the substrate 104 during solder reflow. Rather, the undercut 136 forces a shape of the solder material 128 to have a curvature or gradual transition that serves to reduce the stress in the structure of the solder material 128 under high-G impacts.

Said another way, the undercut 136 receives and forms the solder material 128 during reflow to create a rounded solder corner-to-metal interface.

The solder material 128 may include any type of known or yet-to-be-developed solder material. Suitable materials that can be used for the solder material 128 include, without limitation, a lead alloy solder, a lead-free solder, or a silver alloy solder. In some embodiments, the solder material 128 may be formed into a solder ball 128 having a determined height relative to the bottom surface of the substrate 104 and having a diameter. Illustratively, the solder material 128 may be formed into a solder ball having a diameter between approximately 100 um and 250 um. In more specific but non-limiting examples, the solder ball may have a diameter between approximately 125 um and 200 um.

In some embodiments, the dimension(s) (e.g., height and width) of the undercut 136 may be designed based on the dimension(s) of the solder material 128. For example, the undercut 136 may have a height (see e.g., dimension (d8) of FIG. 3B) and width (see e.g., dimension (d9) of FIG. 3B) between 1 um and 4 um. In a more specific but non-limiting example, the undercut 136 may have a height between 2 um and 4 um and a width between 2 um and 4 um. Thus, in some embodiments, the dimensions of the undercut 136 may be expressed relative to dimensions of the solder material 128 or solder ball formed by the solder material 128. As an example, the diameter of the solder ball formed by the solder material 128 may be at least ten times larger than a dimension (e.g., height or width) of the undercut 136. As another example, the diameter of the solder ball formed by the solder material 128 may be at least one hundred times larger than a dimension of the undercut 136. As another more specific but non-limiting example, the diameter of the solder ball formed by the solder material 128 may be on the order of approximately 125 um whereas the width and height of the undercut 136 may be on the order of approximately 2 um to 4 um. In this example, the diameter of the solder ball formed by the solder material 128 may be at least sixty-two times the height or width of the undercut 136. If the solder ball exhibited a diameter of 200 um, then the ratio of solder ball diameter to undercut 136 height or width would be approximately 100:1.

Figure 2A:
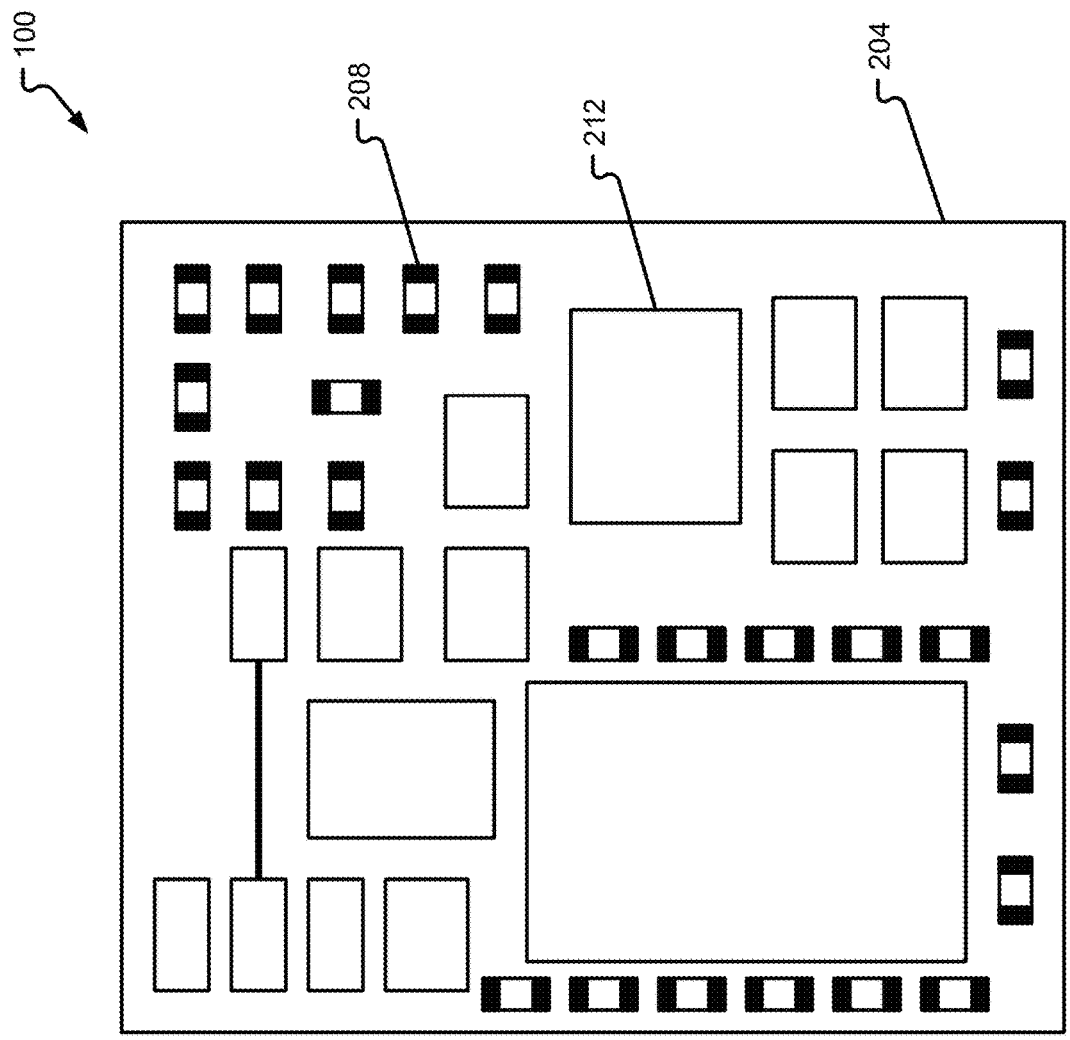
FIG. 2A is a top planar view of a device in accordance with at least some embodiments of the present disclosure.
Figure 2B:
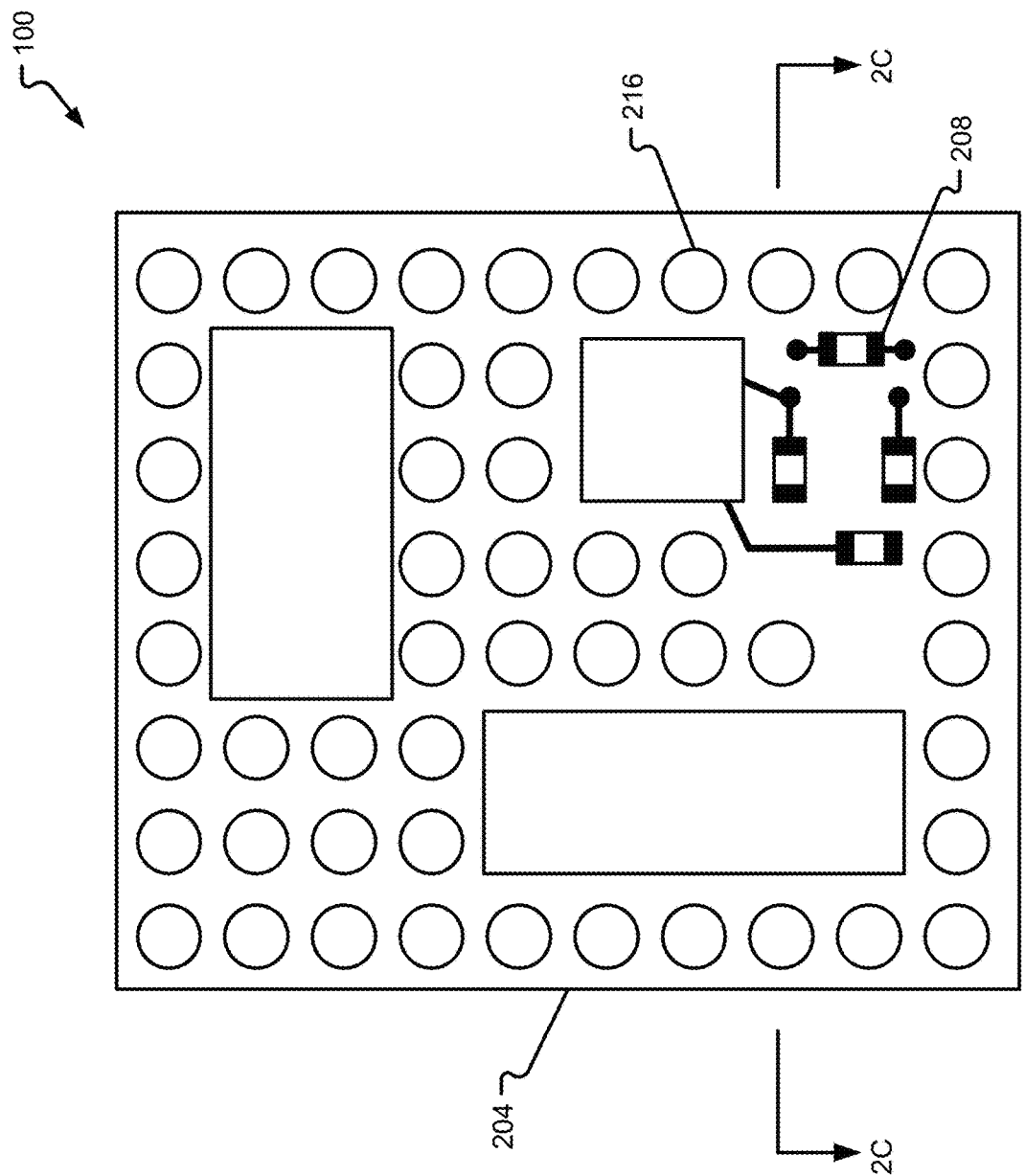
FIG. 2B is a bottom planar view of the device depicted in FIG. 2A.

With reference now to FIGS. 2A thru 2D, additional details of a device 100 or a package (e.g., a wireless filter or communication semiconductor package) that may be included in a device 100 will be described in accordance with at least some embodiments of the present disclosure. Referring initially to FIGS. 2A and 2B, the device 100 is shown to include a PCB 204 having a number of circuit components provided on each surface thereof. Specifically, a top surface of the PCB 204 is shown to include a number of passive circuit components 208 and active circuit components 212 thereon. The PCB 204 may correspond to an example of the substrate 104. The passive circuit components 208 may include one or more of a resistor, inductor, capacitor, or the like. The active circuit components 212 may include one or more of an IC chip, a transistor, a semiconductor package, or the like.

In addition to including the passive circuit components 208 and active circuit components 212, and as shown in FIG. 2B, the PCB 204 may include a number of solder balls 216 distributed across a bottom surface thereof. In some embodiments, the solder balls 216 may be distributed in an array or grid-type of format across the bottom surface of the PCB 204. The top surface of the PCB 204, however, may only have passive circuit components 208 and active circuit components 212 provided thereon.

Figure 2C:
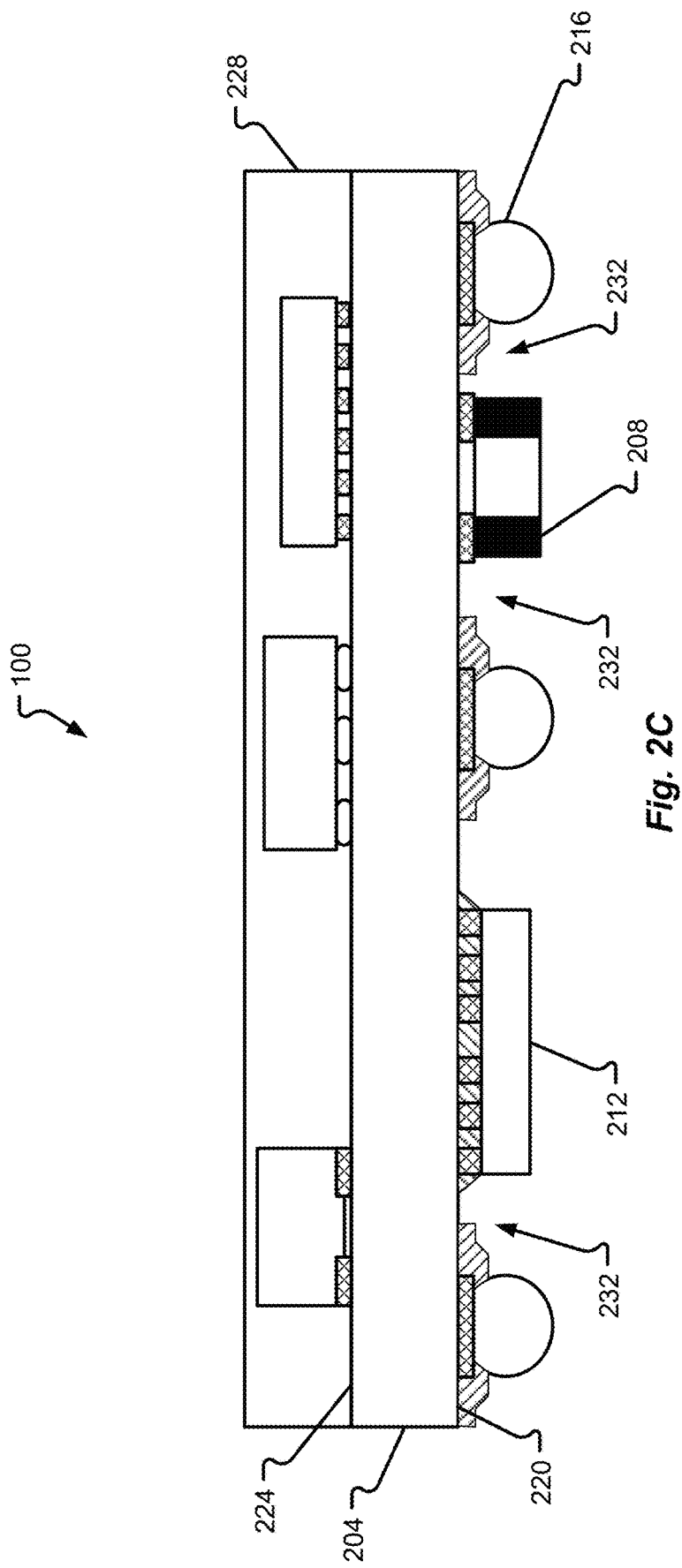
FIG. 2C is a cross-sectional view of the device depicted in FIGS. 2A and 2B across line 2C-2C.
Figure 2D:
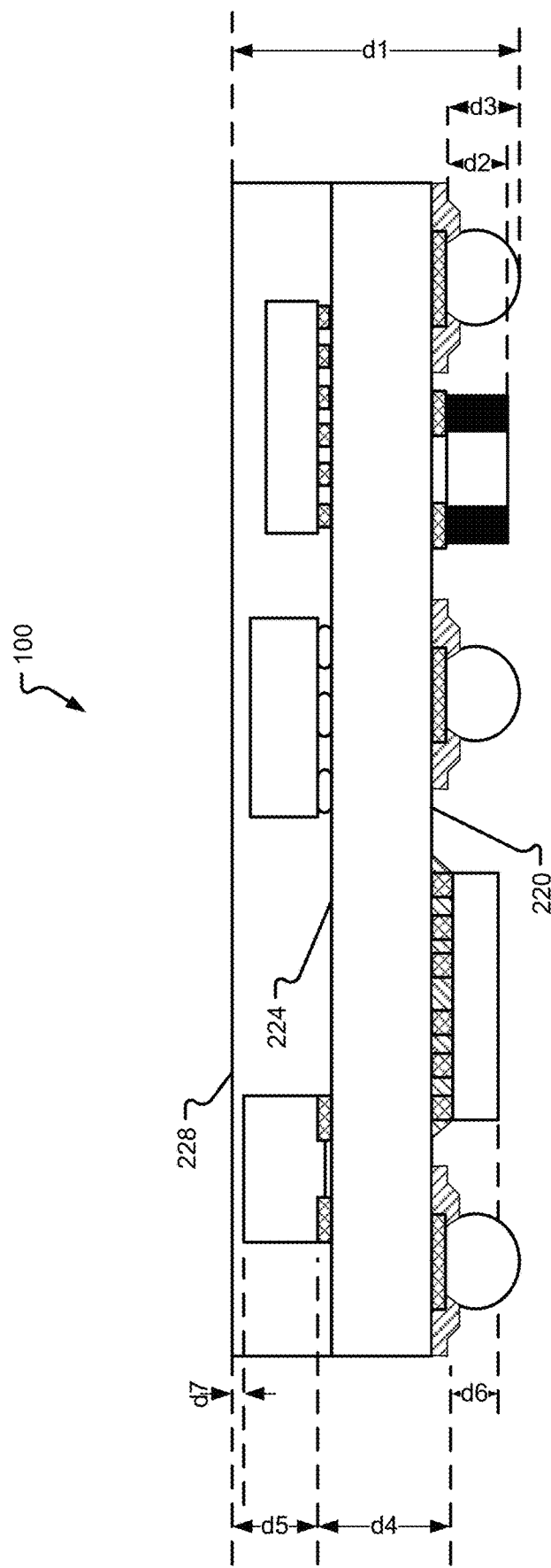
FIG. 2D is a cross-sectional view of the device from FIG. 2C further illustrating various dimensions of the device in accordance with embodiments of the present disclosure.

As can be seen in FIGS. 2C and 2D, the components provided on a bottom surface or first surface 220 of the PCB 204 may not be protected by a molding material. Rather, one or more air gaps 232 may be provided between solder balls 216, passive circuit components 208, and active circuit components 212. The components provided on the top surface or second surface 2224 of the PCB 204, on the other hand, may be encapsulated or protected with a molding 228 material (e.g., an epoxy molding, a plastic material, or the like). The molding 228 may provide additional protection for the passive circuit components 208 and active circuit components 212 whereas the components provided on the bottom surface or first surface 220 of the PCB 204 may not have the benefit of a surrounding material to protect the integrity of the connections between the components and the PCB 204. Thus, as will be depicted and described in further detail herein, one or more of the solder balls 216 may connect with the PCB 204 via a solder material receiving curved surface 116 and at least some solder material 128 of a solder ball 216 may be secured within an undercut established between a solder resist material 132 and the solder material receiving curved surface 116.

FIG. 2D further illustrates various dimensions of the device 100 or the package that may be included in a device. Specifically, a first dimension (d1) is shown to represent a total height of the package. In some embodiments, the first dimension (d1) may represent a linear distance between a top surface of the molding 228 and a bottom of the solder balls 216. In some embodiments, the first dimension (d1) may be approximately 900 um.

A second dimension (d2) represents a height of a passive component 208 provided on the bottom surface or first surface 220 of the PCB 204 whereas a third dimension (d3) represents a height of the solder ball 216. As shown in FIG. 2D, the third dimension (d3) may be larger than the second dimension (d2). The amount by which the third dimension (d3) is larger than the second dimension (d2) may be on the order of 10 um to 20 um. In some embodiments, the third dimension (d3) is approximately 125 um and the second dimension (d2) is approximately 85 um.

A fourth dimension (d4) represents a height or thickness of the PCB 204, which may be on the order of 375 um. A fifth dimension (d5) may represent a height or thickness of the molding 228, which may be on the order of 350 um to 370 um. A sixth dimension (d6) may represent a height of an active component 212 provided on the bottom surface or first surface 220 of the PCB 204. Much like the second dimension (d2), the sixth dimension (d6) should be less than the third dimension (d3). In some embodiments, the sixth dimension (d6) is on the order of 95 um to 100 um. A seventh dimension (d7) may represent a clearance between the tallest component on the top surface or second surface 224 of the PCB 204 and the top of the molding 228. In some embodiments, the seventh dimension (d7) may be on the order of 30 um to 50 um.

Figure 3B:
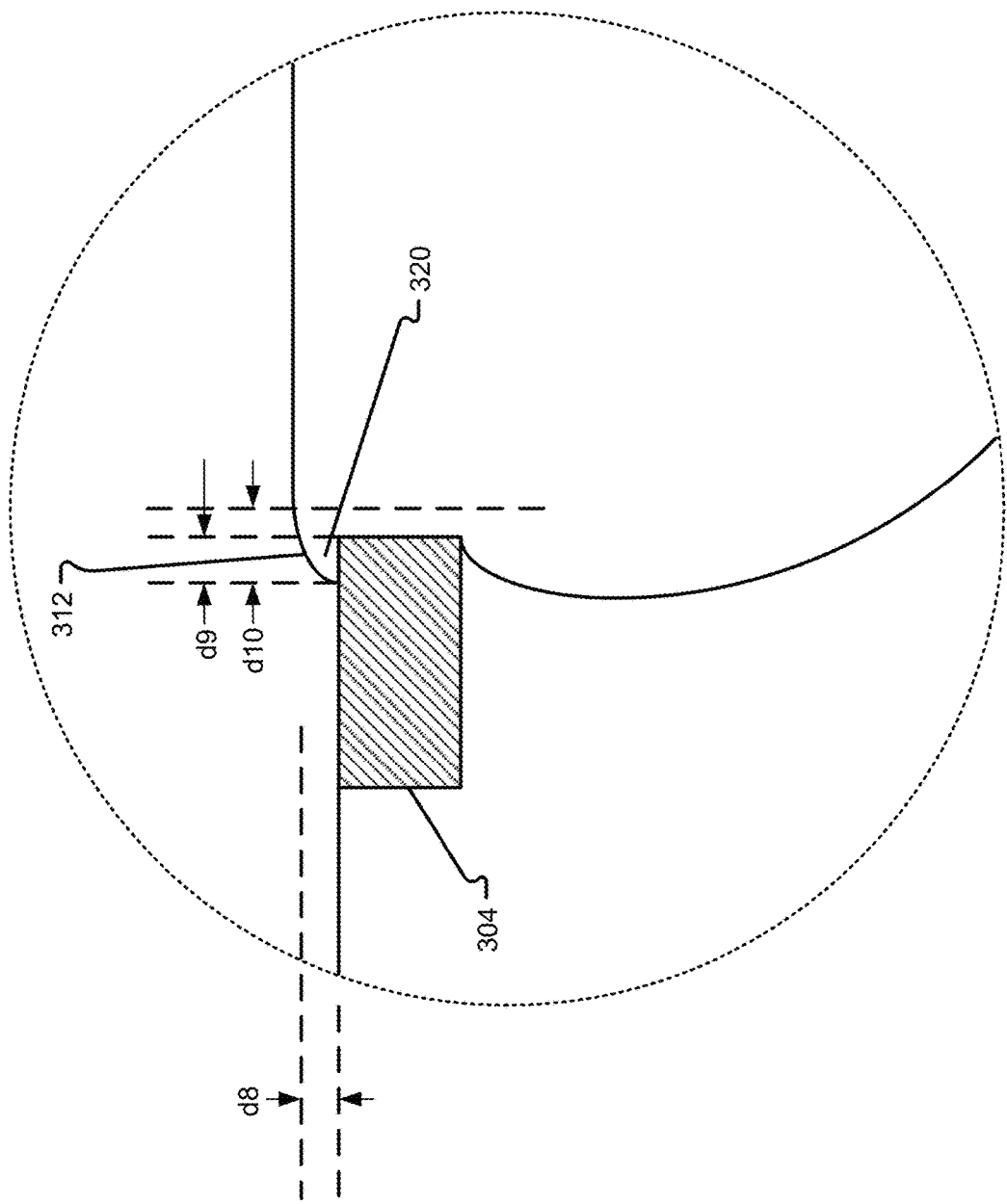
FIG. 3B is an exploded cross-sectional view of the solder material receiving curved surface depicted in FIG. 3A.

With reference now to FIGS. 3A and 3B, additional details and dimensions of a solder ball 216 and the interface between the solder ball 216 and the PCB 204 will be described in accordance with at least some embodiments of the present disclosure. FIGS. 3A and 3B depict specific but non-limiting examples of solder resist material 304, a metal layer 308, and the undercut 320 formed between the solder resist material 304 and the solder material receiving curved surface 116 provided on the metal layer 308. In some embodiments, the solder resist material 304 is similar or identical to the solder resist material 132. In some embodiments, the metal layer 308 may correspond to a metal trace and/or an example of a penultimate metal layer 108N. Alternatively or additionally, the metal layer 308 may correspond to a metal layer provided in a PCB 204. In such an example, the metal layer 308 may be exposed at the bottom surface or first surface 220 of the PCB 204.

The metal layer 308 is further shown to include an edge portion 312 and a middle portion 316 surrounded by the edge portion 312. In some embodiments, the edge portion 312 is partially or completely overlapped or covered by the solder resist material 304. At least some of the overlap between the edge portion 312 and the solder resist material 304 may form the undercut 320, which is configured to receive and trap the solder material of the solder ball 216. The edge portion 312 may be similar or identical to the edge portion 120. Likewise, the middle portion 316 may be similar or identical to the middle portion 124. In some embodiments, the edge portion 312 and middle portion 316 contribute to the solder material receiving curved surface 116 of the metal layer 308. In the depicted embodiment, the middle portion 316 is substantially planar or flat whereas the edge portion 312 exhibits a curved transition between the bottom surface of the metal layer 308 (which may be co-planar with the bottom surface 220 of the PCB 204) and the middle portion 316. This curved transition contributes to the shape and size of the undercut 320.

FIG. 3B illustrates a magnified view of the highlighted section of FIG. 3A. As shown in FIG. 3B, the undercut 320 includes dimensions in both the x-direction (e.g., a width) and the y-direction (e.g., a height). In some embodiments, the height of the undercut 320 is represented by the eighth dimension (d8) while the width of the undercut 320 is represented by a ninth dimension (d9). The relative size of the eighth dimension (d8) and the ninth dimension (d9) may be similar, but do not necessarily need to be identical. Specifically, eighth dimension (d8) may be between approximately 1 um and 4 um. The ninth dimension (d9) may be between approximately 1 um and 6 um. In some embodiments, the ninth dimension (d9) may completely represent a width of the edge portion 312. In other embodiments, however, the edge portion 312 may extend beyond the solder resist material 304 (e.g., not be totally overlapped by the solder resist material 304). In such a configuration, the width of the edge portion 312 may be represented by a tenth dimension (d10), which is shown to be larger than a width of the undercut 320, which is represented by the ninth dimension (d9).

Figure 4:
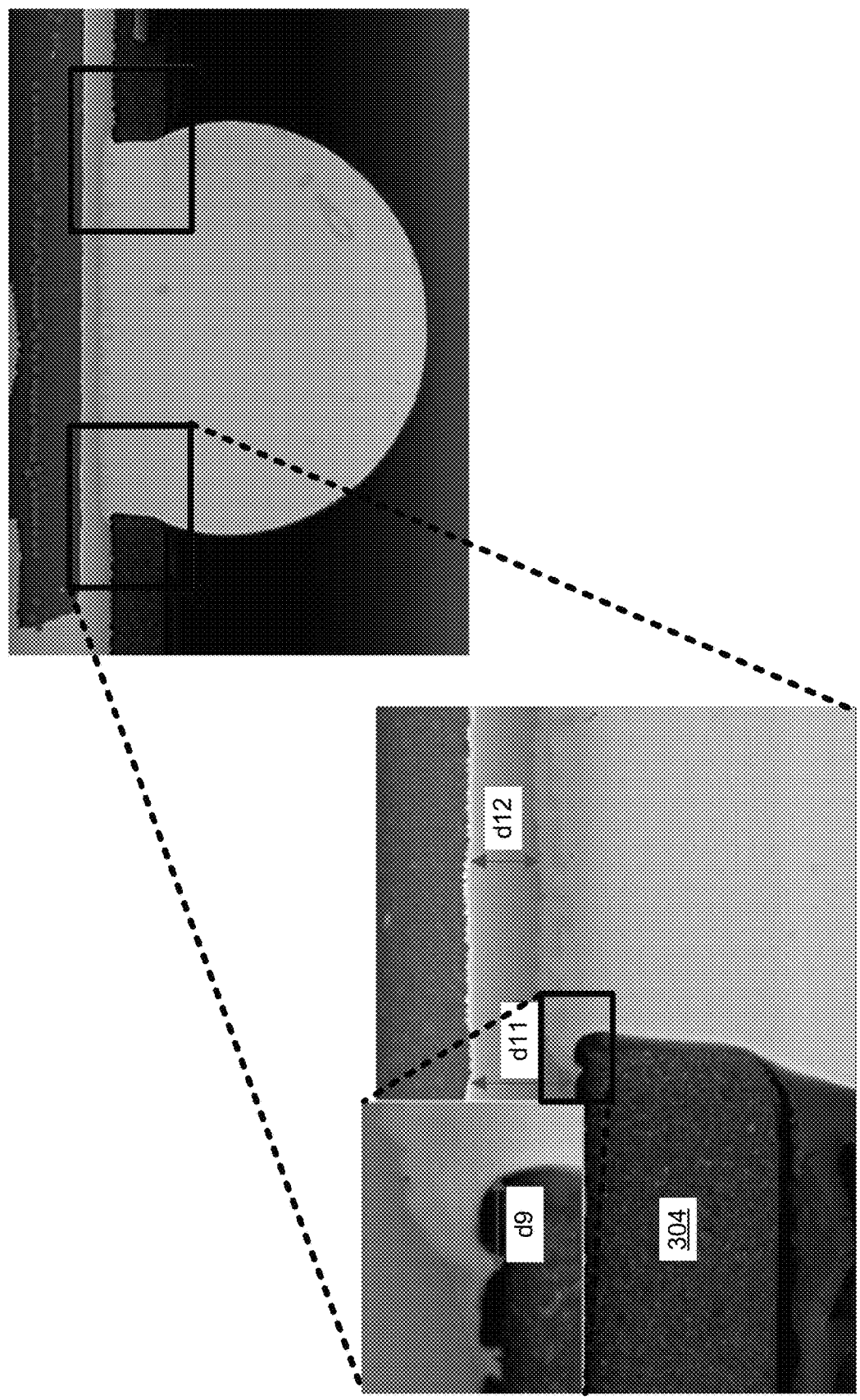
FIG. 4 illustrates various views of an example solder ball and solder material receiving curved surface in accordance with embodiments of the present disclosure.

FIG. 4 illustrates another example of the undercut 320 and the ninth dimension (d9). FIG. 4 further illustrates additional dimensions of the metal layer 308. Specifically, an eleventh dimension (d11) and twelfth dimension (d12) are shown as further possible configurations for a metal layer 308. In some embodiments, the eleventh dimension (d11) may correspond to a height from the solder resist material 132 to the top of the metal layer 308. The eleventh dimension (d11) may range between approximately 8 um and 14 um. The twelfth dimension (d12) may correspond to a thickness of the metal layer 308 across the middle portion 316 of the solder material receiving curved surface 116. In some embodiments, the twelfth dimension (d12) may range between approximately 2 um and 7 um. In some embodiments, the difference between the twelfth dimension (d12) and the eleventh dimension (d11) may equal the eighth dimension (d8).

Figure 5:
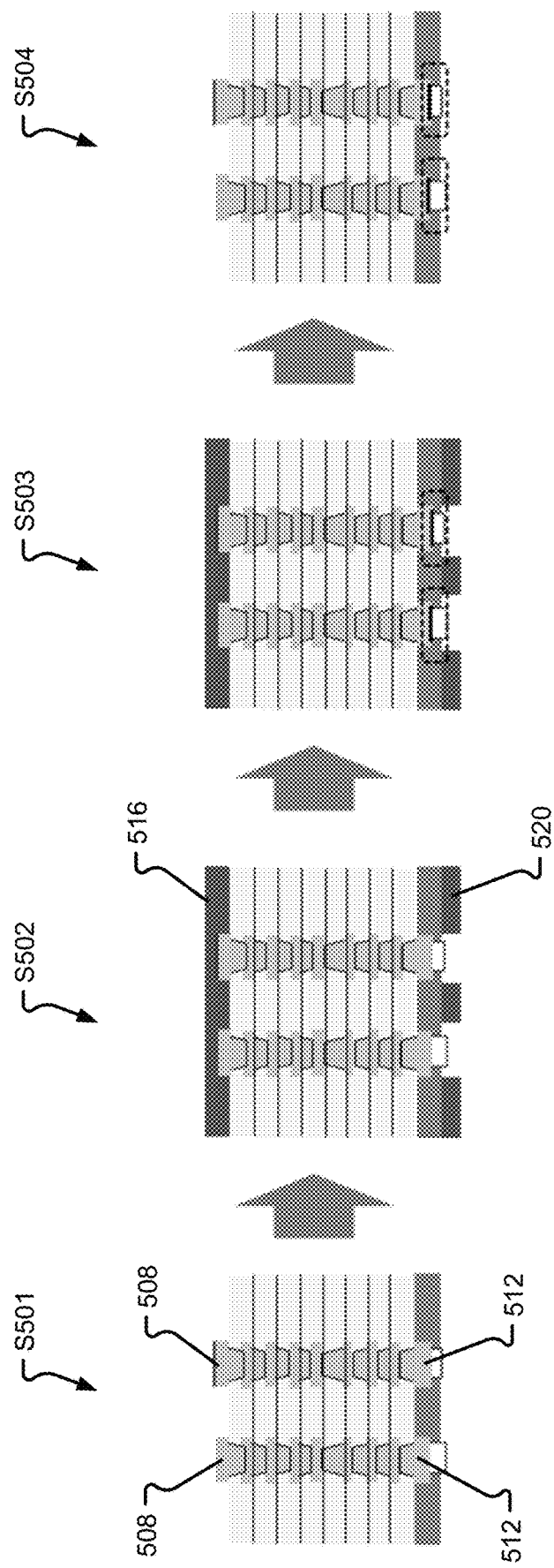
FIG. 5 is a flow diagram depicting an illustrative process for producing a substrate in accordance with embodiments of the present disclosure.

Referring now to FIG. 5, additional details of a method for manufacturing a substrate 104 or PCB 204 will be described in accordance with at least some embodiments of the present disclosure. The method begins by providing a substrate 104 or PCB 204 with a vertical stack of electrical interconnect structures 508 therein (step S501). In some embodiments, the substrate 104 or PCB 204 may include a plurality of vertical stacks of electrical interconnect structures 508. One, some, or all of the vertical stacks of electrical interconnect structures 508 may include a penultimate metal layer 512 exposed at a bottom surface of the substrate 104 or PCB 204.

The method continues by providing a protective or masking layer over a top and bottom surface of the substrate 104 or PCB 204 (step S502). In some embodiments, a first protective layer 516 is provided completely over the top surface of the substrate 104 or PCB 204 while a second protective layer 520 is provided over some, but not all, of the bottom surface of the substrate 104 or PCB. The second protective layer 520 may expose the penultimate metal layers 512 such that during an etching process (step S503), undercuts 136, 320 may be formed between the solder receiving curved metal surfaces 116 of the penultimate metal layers 116, 512 and a solder resist material 132, 304, which is also currently covered by the second protective layer 520. In some embodiments, the etching process may include a flash etching process that helps create an anchor structure within the undercut 136, 320.

The method then continues by removing or stripping away the protective layers 516, 520 (step S504). In some embodiments, it may be desirable to process the top and bottom surfaces as described herein. In some embodiments, if solder balls are only being provided on one surface (e.g., a bottom surface of the substrate 104 or PCB 204), then it may be possible to only perform the steps depicted and described herein for the bottom surface while leaving the top surface completely protected during all steps of the process.

Figure 6A:
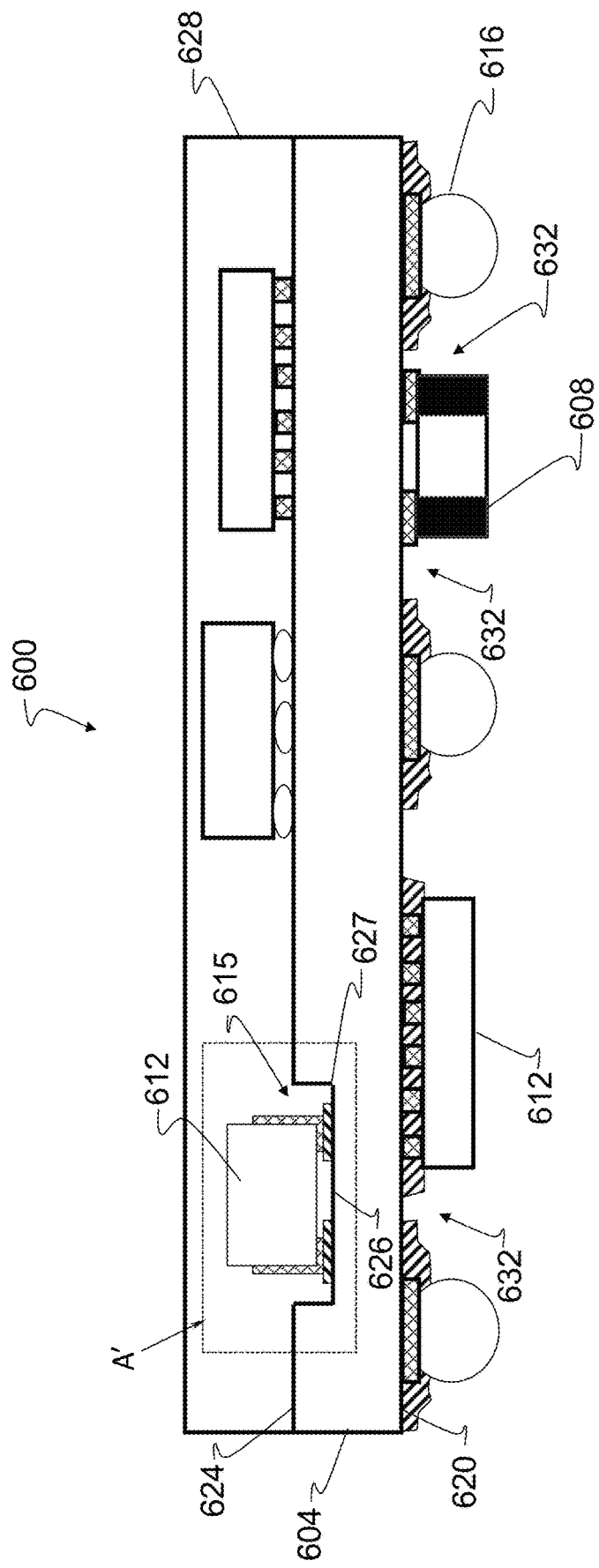
FIG. 6A is a cross-sectional view of a device in accordance with at least some embodiments of the present disclosure.

With reference now to FIG. 6A, another configuration of a device 600 will be described in accordance with at least some embodiments of the present disclosure. As shown, FIG. 6A is similar to FIG. 2C. Thus, common features or features having similar reference numerals will not be re-described for ease of conversation. For example, the device 600 includes a substrate or a PCB 604 having a number of circuit components provided on each surface thereof. Similar to FIG. 2C, a number of passive circuit components 608 and active circuit components 612 are disposed on a top surface 624 and a bottom surface 620 of the PCB 604. The passive circuit components 608 may include one or more of a resistor, inductor, capacitor, or the like. The active circuit components 612 may include one or more of an IC chip, a transistor, a semiconductor package, or the like. The PCB 604 may include a number of solder balls 616 distributed across the bottom surface 620 thereof. The components provided on the bottom surface 620 of the PCB 604 may not be protected by a molding material. Rather, one or more air gaps 632 may be provided between solder balls 616, passive circuit components 608, and active circuit components 612. The components provided on the top surface 624 of the PCB 604, on the other hand, may be encapsulated or protected with a molding material 628 (e.g., an epoxy molding, a plastic material, or the like). One or more of the solder balls 616 may connect with the PCB 604 via a solder material receiving curved surface 116 and at least some solder material 128 of a solder ball 616 may be secured within an undercut established between a solder resist material 132 and the solder material receiving curved surface 116 as described earlier.

As shown in FIG. 2C, the PCB 204 includes a planar top surface 224 and a planar bottom surface 220. The PCB 604 of FIG. 6A, on the other hand, differs from the PCB 204 of FIG. 2C in that the PCB 604 includes at least one cavity 615 in at least one of the bottom surface 620 and top surface 624. In the depicted embodiment, the cavity 615 is provided in the top surface 624, but it should be appreciated that the bottom surface 620 may alternatively or additionally be provided with a cavity 615. The cavity 615, as shown in FIG. 6A, is disposed in the substrate or PCB 604 such that the top surface 624 corresponds to a first top surface that is positioned above the cavity 615 and the PCB 604 further includes a second top surface 626 that is positioned within the cavity 615 or forms part of the cavity 615.

Figure 6B:
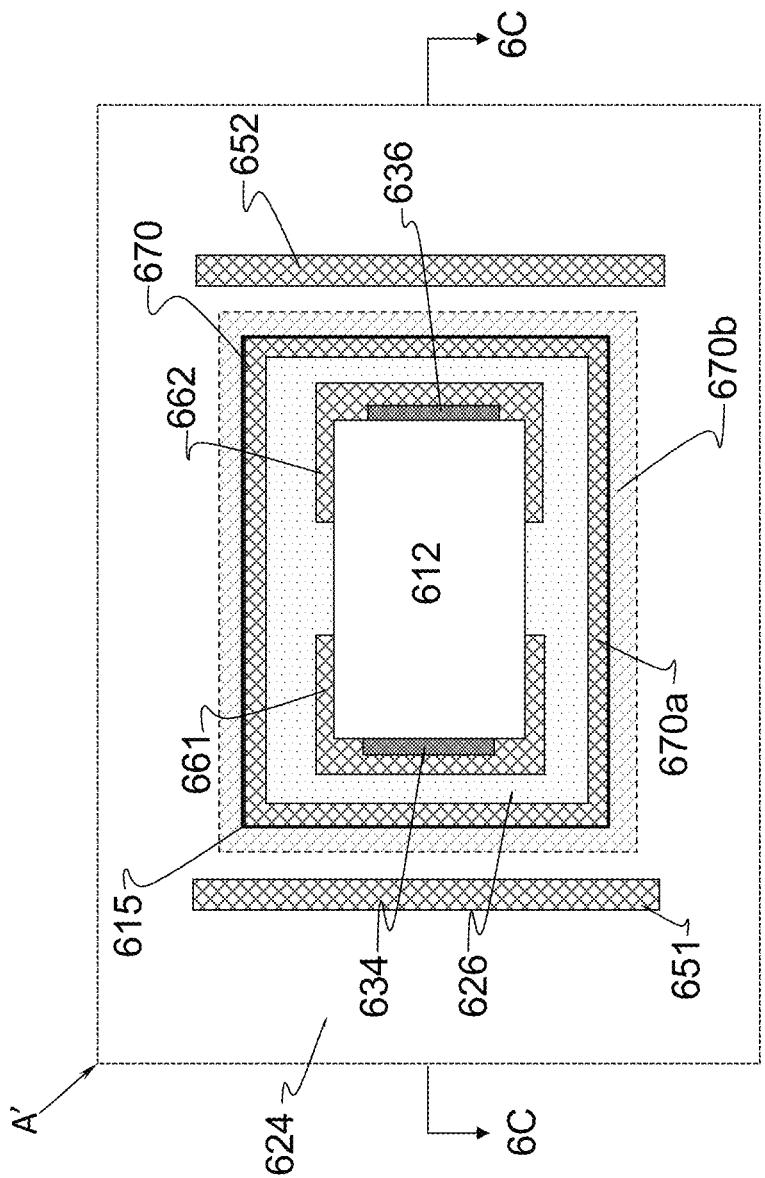
FIG. 6B is a top planar view of the device depicted in FIG. 6A within portion A'.
Figure 6C:
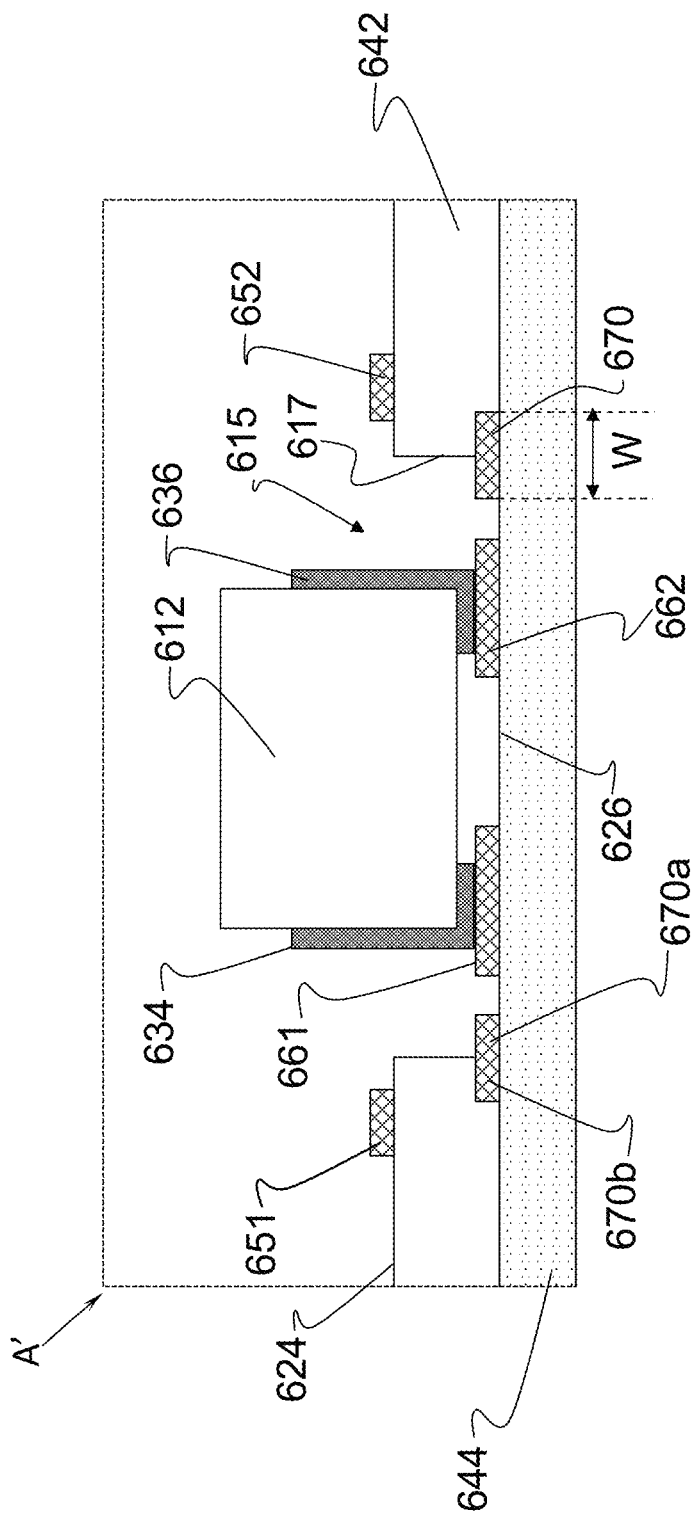
FIG. 6C is cross-sectional view of the device depicted in FIG. 6B across line 6C-6C.

With reference now to FIGS. 6B and 6C, additional details of a portion A' of the device 600 of FIG. 6A will be described in accordance with at least some embodiments of the present disclosure. Referring to FIGS. 6B and 6C, the substrate or PCB 604 includes multiple metal layers separated by one or multiple insulating layers, indicated by representative first insulating layer 642 and second insulating layer 644, for purposes of illustration. For the sake of convenience, the second insulating layer 644 is shown as a bottom insulating layer, although it is understood that the PCB 604 may include additional metal layer(s) separated by additional insulating layer(s) below the second insulating layer 644, without departing from the scope of the present teachings. The first insulating layer 642 and the second insulating layer 644 may be formed of any suitable substantially electrically insulating material compatible with fabrication of PCBs. By way of an example, the first insulating layer 642 may be formed of a photoimageable dielectric material and the second insulating layer 644 may be formed of a prepreg material and/or resin-based dielectric material. As described, the PCB 604 of the device 600 includes a cavity 615. The device 600, as shown, comprises an inner substrate wall 617 that surrounds the second top surface 626 so as to define the cavity 615. The inner substrate wall 617 corresponds to exposed portions of the first insulating layer 642 which are adjacent to and facing the cavity 615.

As shown in FIGS. 6B and 6C, the device 600 includes a plurality of conductive structures 651, 652, 661, 662 for connecting the various circuit components to the PCB 604. For example, conductive structures 661 and 662 may be disposed on the second top surface 626 located inside the cavity 615 allowing a circuit component to be mounted thereon. Additional conductive structures 651 and 652 may optionally be provided on the first top surface 624 located outside of the cavity 615 which allows for connection of various circuit components to the PCB or for wire bonding connection to external devices. The conductive structures 651, 652, 661 and 662 may be in the form of contact pads. Alternatively, the conductive structures 651, 652, 661 and 662 may be in the form of conductive traces.

For simplicity and for illustration purposes, an integrated circuit (IC) chip, being one example of an active circuit component 612, is shown to be mounted to the second top surface 626 within the cavity 615. Additional circuit components may also be disposed within the cavity 615. As shown, the active circuit component 612 is electrically coupled to the conductive structures 661 and 662. The active circuit component 612 may be electrically coupled to the conductive structures 661 and 662 through a first terminal 634 and a second terminal 636. The first terminal 634 and second terminal 636, for example, may include L-shaped terminals (optional). Other suitable types of terminals, including but not limited to solder balls, conductive bumps, and/or copper pillars, may be incorporated without departing from the scope of the present teachings.

The device 600 further includes a substantially looped conductive trace 670. As shown in FIGS. 6B and 6C, the substantially looped conductive trace 670 is disposed in the substrate or PCB 604 such that an inner substantially looped portion 670a of the substantially looped conductive trace 670 is disposed on the second top surface 626 and an outer substantially looped portion 670b of the substantially looped conductive trace 670 is enclosed within the substrate 604 under the inner substrate wall 617. In other words, the inner substantially looped portion 670a is exposed through the cavity while the outer substantially looped portion 670b is covered by the first insulating layer 642. As shown, the circuit component 612 is disposed within the cavity 615 on the second top surface 626 and is distanced away from the substantially looped conductive trace 670. The second top surface 626 of the substrate having a substantially electrically insulating material is adjacent to the substantially looped conductive trace 670.

In some embodiments, the inner substantially looped portion 670a and the outer substantially looped portion 670b of the substantially looped conductive trace 670 are coaxially aligned. The inner substantially looped portion 670a and the outer substantially looped portion 670b, for example, may be a single unitary structure.

In the depicted embodiment, the substantially looped conductive trace 670 has a rectangular shape and the inner substrate wall 617 has four planar portions defining a cuboidal cavity. In other embodiments, the substantially looped conductive trace 670 and the cavity 615 may be formed in other suitable shapes. In some embodiments, the substantially looped conductive trace 670 completely surrounds an edge 627 of the second top surface 626. In such case, the substantially loop conductive trace 670 may comprise a conductive ring that completely surrounds an edge 627 of the second top surface 626. In some other embodiments, the substantially looped conductive trace 670 has at least one gap (not shown) which prevents the substantially looped conductive trace 670 from surrounding entirely an edge 627 of the second top surface 626.

The substantially looped conductive trace 670 has a trace width (W). In some embodiments, the inner substantially looped portion 670a comprises a width that is at least 50% of the trace width (W) of the substantially looped conductive trace 670. In other embodiments, the inner substantially looped portion 670a may comprise other suitable width dimensions. The substantially looped conductive trace 670, for example, may comprise the same material as the conductive structures 661 and 662. For example, the substantially looped conductive trace 670 and the conductive structures 661 and 662 may be formed of copper. Alternatively, the substantially looped conductive trace 670 may comprise different material than that of the conductive structures 661 and 662.

Figure 7A:
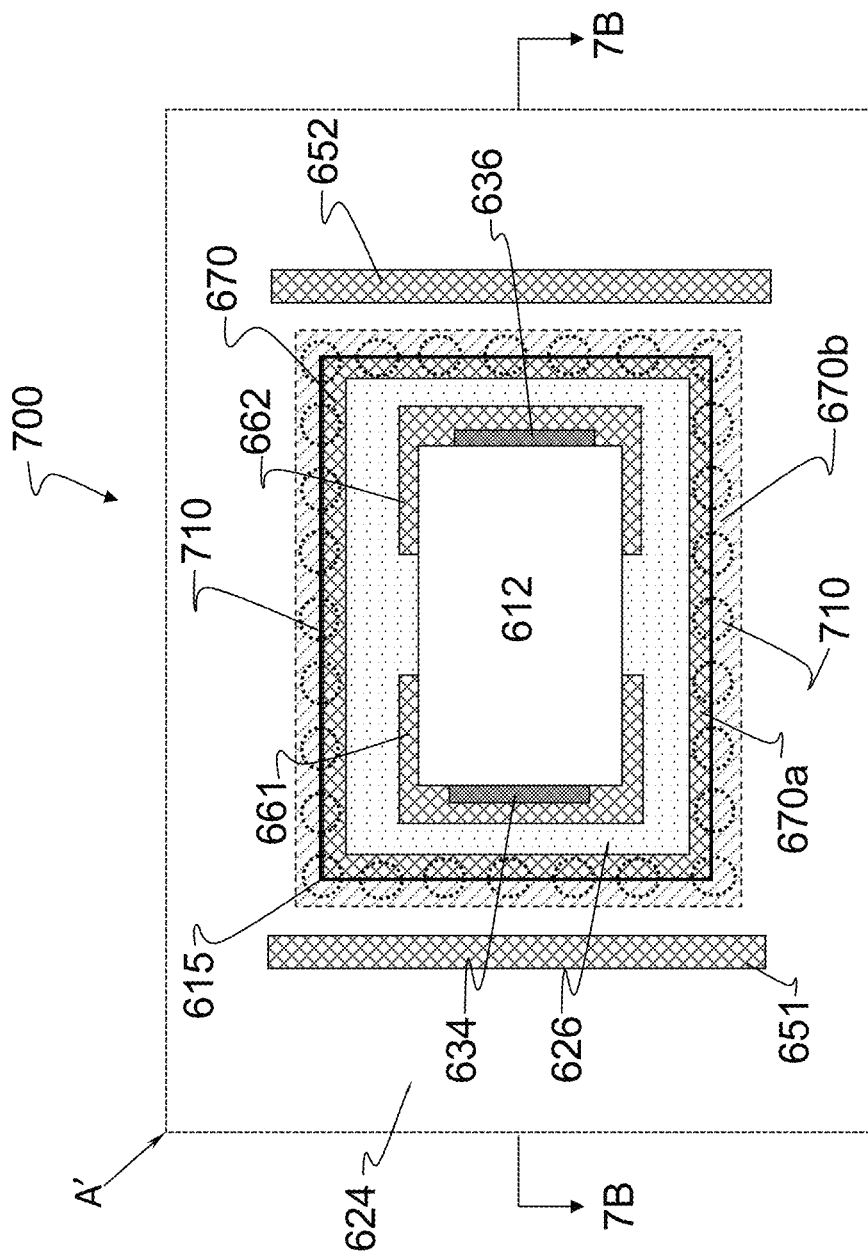
FIG. 7A is a top planar view of an alternative configuration of the device depicted in FIG. 6A within portion A'.
Figure 7B:
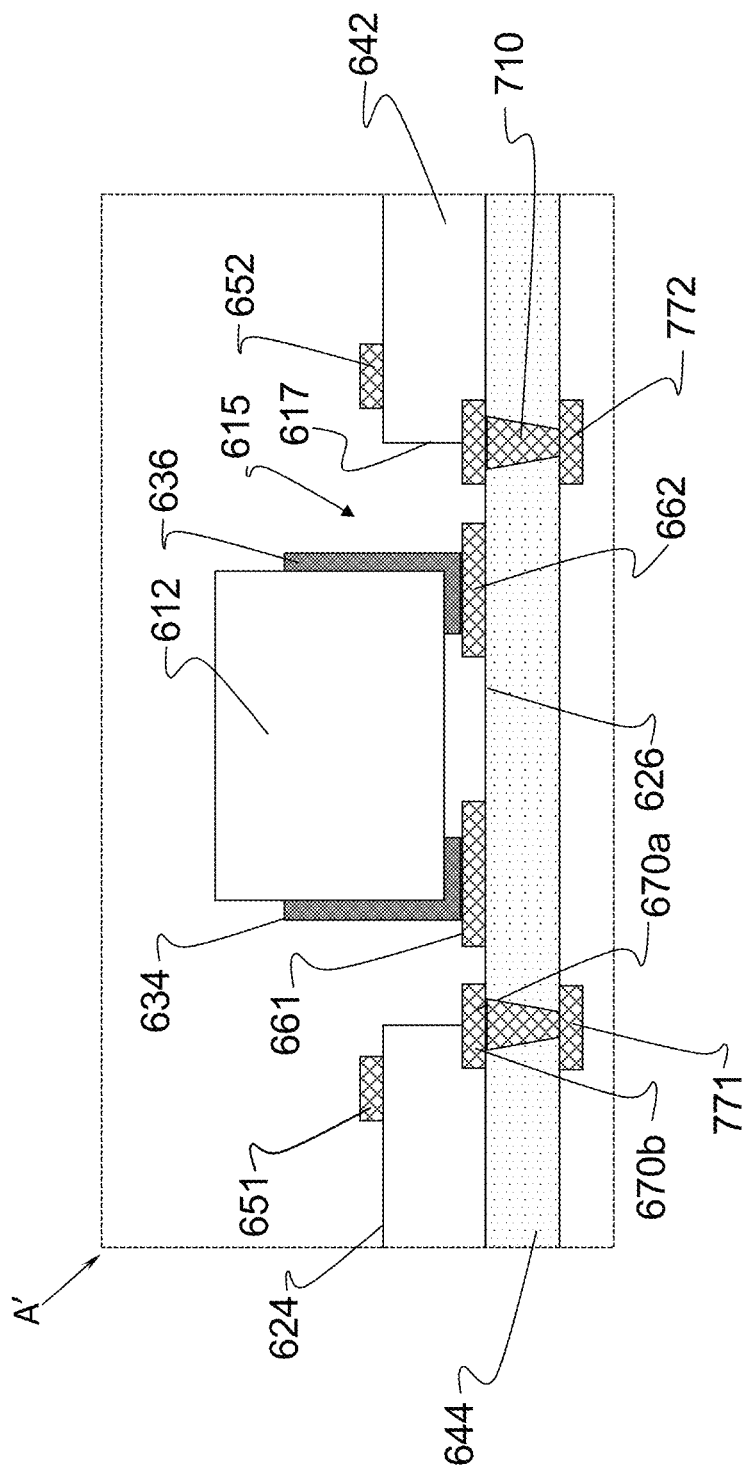
FIG. 7B is a cross-sectional view of the device depicted in FIG. 7A across line 7B-7B.

FIGS. 7A and 7B show another embodiment of a device 700. FIG. 7A is similar to FIG. 6A while FIG. 7B is similar to FIG. 6B. In the interest of brevity, features having the same reference numerals will not be re-described or described in detail. The device 700, in one embodiment, differs from the device 600 in that the device 700 further comprises a plurality of conductive vias 710 disposed below the substantially looped conductive trace 670. In some embodiments, the plurality of conductive vias 710 form a loop therein below the cavity 615 within the substrate or PCB 604. Depending on the configuration of the substantially looped conductive trace 670, the plurality of conductive vias 710 may completely surround an edge 627 of the second top surface 626. In some other embodiments, the plurality of the conductive vias 710 may partially surround an edge 627 of the second top surface 626.

As shown, a plurality of conductive structures 771 and 772 are disposed below a bottom surface of the second insulating layer 644. The plurality of conductive structures 771 and 772, for example may be in the form of contact pads. Alternatively, the conductive structures 771 and 772 may be in the form of conductive traces. The plurality of conductive vias 710 are electrically coupled to the plurality of conductive structures 771 and 772. The plurality of conductive structures 771 and 772, in one embodiment, are electrically coupled to a ground potential. In such case, the plurality of conductive vias 710 serve as ground vias, thereby improving the shielding performance of the device 700.

Figure 8:
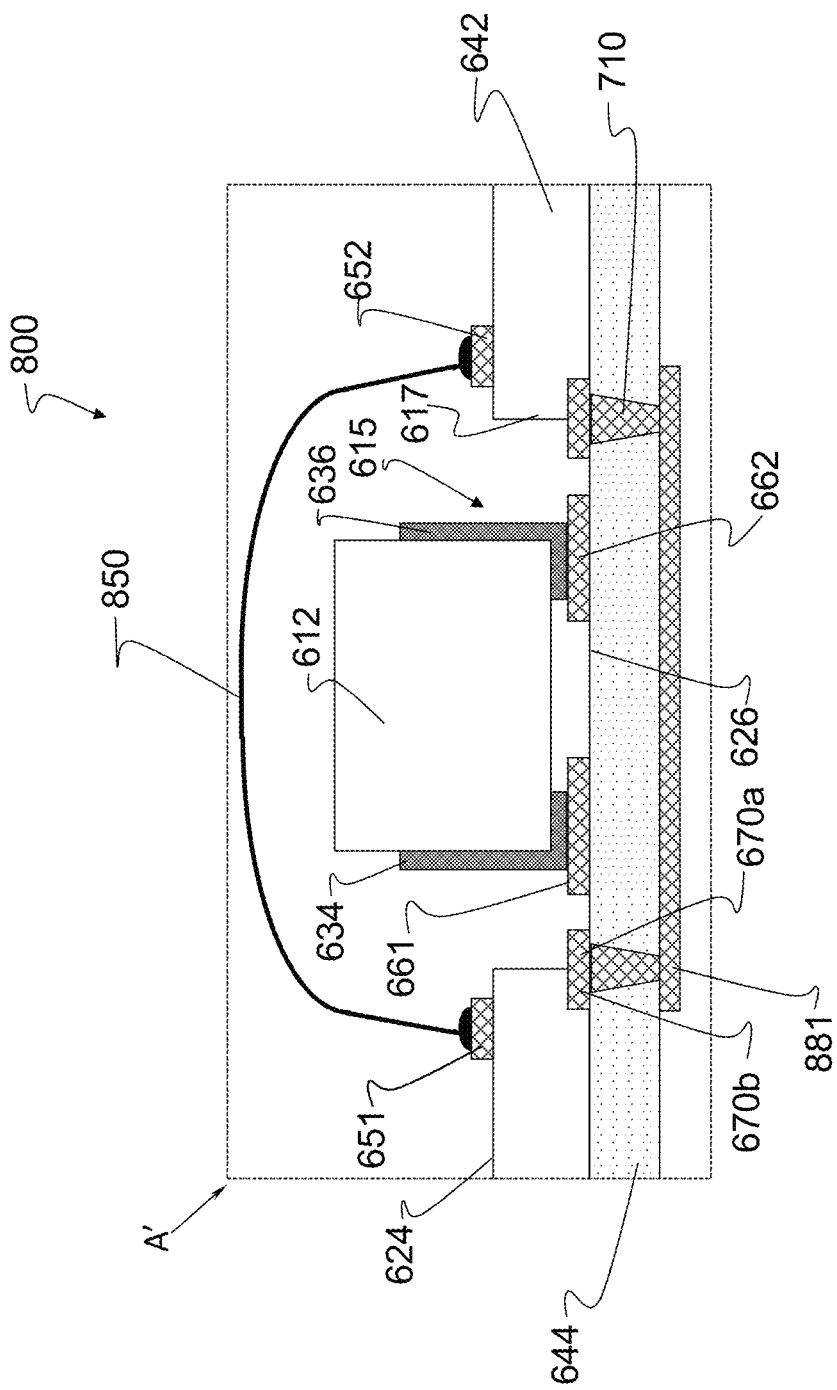
FIG. 8 is a cross-sectional view of an alternative configuration of the device depicted in FIG. 7A across line 7B-7B.

FIG. 8 shows another embodiment of a device 800. FIG. 8 is similar to FIG. 7B. In the interest of brevity, features having the same reference numerals will not be re-described or described in detail. The device 800, in one embodiment, differs from the device 700 in that the device 800 further comprises a plurality of conductive vias 810 disposed above the substantially looped conductive trace 670.

In the depicted embodiment, the plurality of conductive vias 710 form a lower ring via that electrically connects the substantially looped conductive trace 670 to a bottom surface 620 of the substrate or PCB 604, while the plurality of conductive vias 810 form an upper ring via that electrically connects the substantially looped conductive trace 670 to a first top surface 624 of the substrate or PCB 604. The plurality of conductive vias 710, for example, may be electrically coupled to a conductive structure 871. The conductive structure 871, for example, may be in the form of a conductive trace. The conductive structure 871, in one embodiment, is coupled to a ground potential. In some embodiments, the device 800 may further include a compartment electromagnetic interference (EMI) shield structure 850 disposed over the circuit component 612 and electrically coupled to the plurality of conductive vias 810 and the substantially looped conductive traces 670. The EMI shield structure 850, for example, may be as described in U.S. Pat. No. 10,076,023 to Choi and U.S. Pat. No. 10,134,686 to Lee, the disclosures of which are hereby incorporated herein by reference in their entireties. The provision of the EMI shield structure 850, as shown, further enhances the shielding performance of the device 800.

Figure 9A:
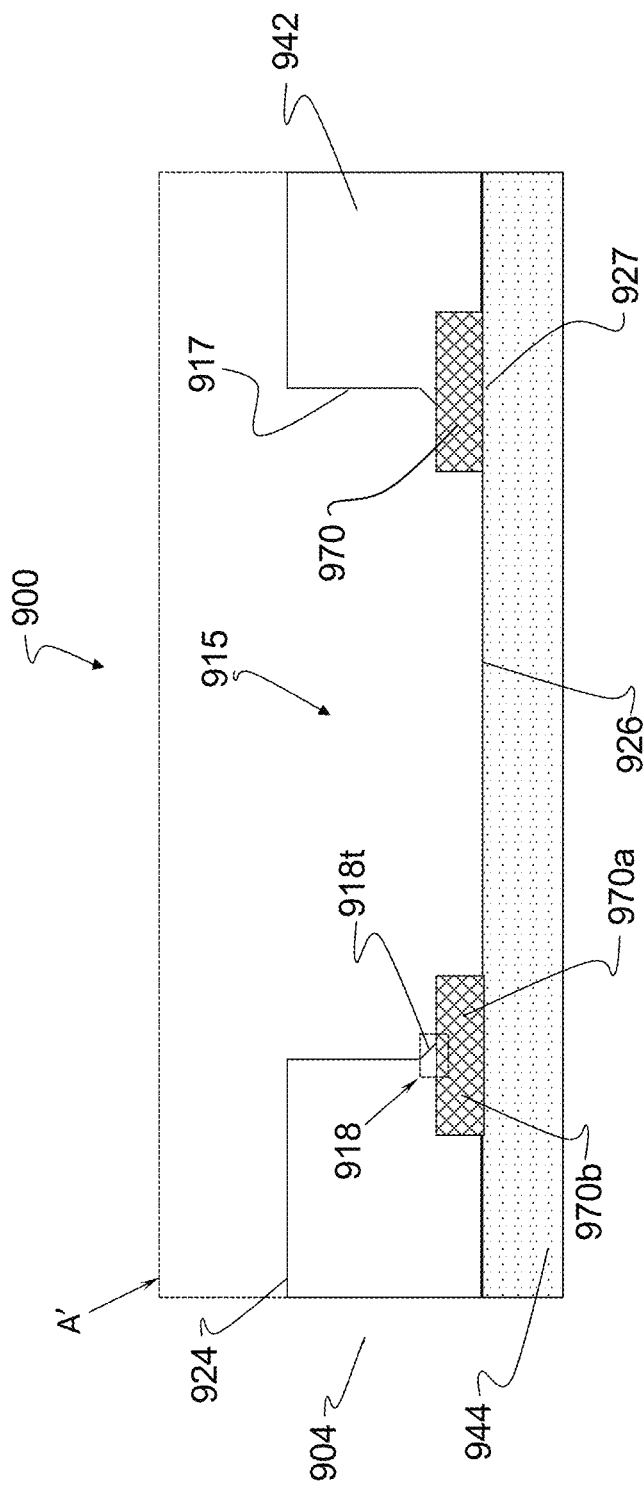
FIG. 9A is a cross-sectional view of yet another alternative configuration of the device depicted in FIG. 7A across line 7B-7B.

FIG. 9A shows another embodiment of a device 900. As shown, FIG. 9A is similar to FIG. 6C. Thus, common features or features having similar reference numerals will not be re-described or described in detail. For example, the device 900 includes a substrate or a PCB 904 having a number of circuit components provided on each surface thereof. Similar to FIG. 6C, the substrate or PCB 904 includes multiple metal layers separated by multiple insulating layers, indicated by representative first insulating layer 942 and second insulating layer 944, for purposes of illustration. It is understood that the PCB 904 may include additional metal layer(s) separated by additional insulating layer(s) below the second insulating layer 944. The device 900, as shown, comprises a cavity 915 disposed in the substrate such that the substrate has a first top surface 924 positioned above the cavity 915 and a second top surface 926 positioned within the cavity. The device 900 comprises an inner substrate wall 917 that surrounds the second top surface 926 so as to define the cavity 915. The inner substrate wall 917 corresponds to exposed portions of the first insulating layer 942 which are adjacent to and facing the cavity 915. The device 900 may optionally include a plurality of conductive structures (not shown) for connecting various circuit components (not shown) to the PCB 904.

Similar to FIG. 6C, the device 900 as illustrated in FIG. 9A also includes a substantially looped conductive trace 970. As shown, the substantially looped conductive trace 970 is disposed in the substrate or PCB 904 such that an inner substantially looped portion 970a of the substantially looped conductive trace 970 is disposed on the second top surface 926 and an outer substantially looped portion 970b of the substantially looped conductive trace 970 is enclosed within the substrate 904 under the inner substrate wall 917.

Figure 9B:
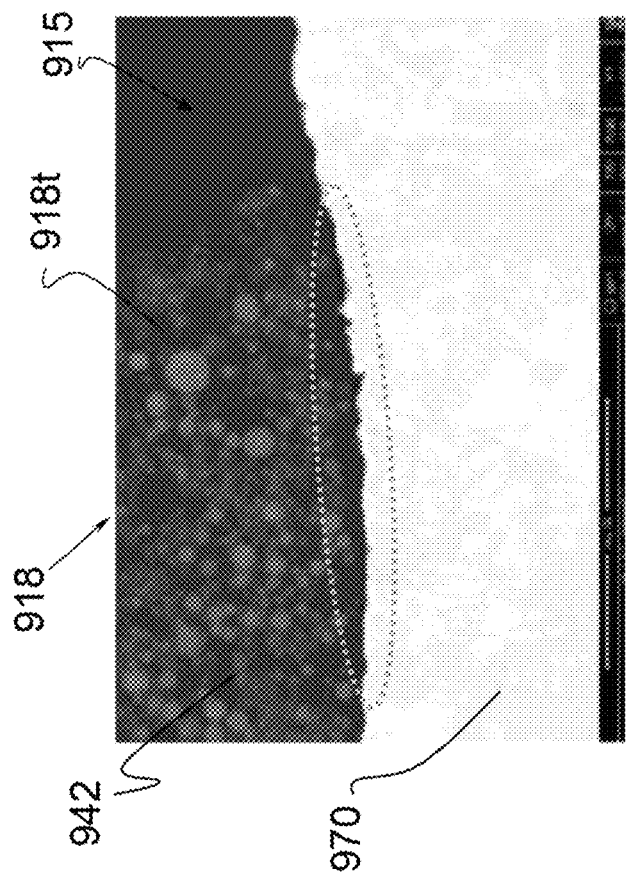
FIG. 9B is an image of a device in accordance with at least some embodiments of the present disclosure.

In one embodiment, the inner substrate wall 917 has a toe portion 918t positioned at a bottom portion 918 of the inner substrate wall 917. The toe portion 918t is tapered towards the cavity 915. The tapered toe portion 918t of the inner substrate wall 917 is formed at the edge 927 of the second top surface 926, which is adjacent to the bottom edge of the cavity 915. FIG. 9B shows a SEM image of a magnified view of a bottom portion of the inner substrate wall. The SEM image of FIG. 9B is a magnified view of the bottom portion 918 of the inner substrate wall 917 of the device 900. An undercut may be observed at the bottom portion of the inner substrate wall of a prior device. The undercut may affect device performance as micro-crevice and delamination may appear in between the insulating layers of the PCB of prior devices. It is believed that the presence of the undercut allows chemical penetration in between the insulating layers of the PCB which may lead to delamination and electro migration. In contrast, the bottom portion 918 of the inner substrate wall 917 of device 900 as shown in FIG. 9B comprises a tapered toe portion 918t which is devoid of an undercut. Additionally, no micro-crevice is found in between the interface of the first insulating layer 942 and the substantially looped conductive trace 970.

At least one example embodiment is directed to a device that includes a substrate, a plurality of metal layers disposed within the substrate, where the plurality of metal layers includes a penultimate metal layer. The device is further disclosed to include a solder material receiving curved surface of the penultimate layer that is configured to receive a solder material. The device is further disclosed to include a solder resist material disposed on a bottom surface of the substrate, where the solder resist material partially covers the solder material receiving curved surface such that a middle portion of the solder material receiving curved surface is exposed and an edge portion of the solder material receiving curved surface that is covered under the solder resist material forms an undercut therein so as to trap an external solder material within the undercut.

According to one aspect, the middle portion of the solder material receiving curved surface is substantially flat. Furthermore, the edge portion may extend approximately 2 um to 4 um from an outer perimeter of the middle portion.

According to one aspect, the solder material receiving curved surface includes a curved surface disposed predominantly within the edge portion.

According to one aspect, the device further includes a solder material disposed within the solder material receiving curved surface. In some embodiments, a portion of the solder material is disposed within the undercut to define a mushroom-shaped interlocking structure. In some embodiments, a width of the solder material is at least ten times larger than a dimension of the undercut.

According to one aspect, the device further includes a vertical stack of interconnect structures disposed within the substrate and the solder material receiving curved surface is electrically and physically connected to the vertical stack of interconnect structures. In some embodiments, the vertical stack of interconnect structures are substantially aligned with one another.

Another example embodiment provides a substrate having a first surface, a second surface that opposes the first surface, and a metal layer that is exposed at the second surface. In some embodiments, the metal layer includes a solder material receiving curved surface having an edge portion that is partially covered by a solder resist material such that an undercut is formed between the solder resist material and the edge portion so as to trap an external solder material within the undercut.

According to one aspect, the solder material receiving curved surface further includes a middle portion that is substantially planar. In some embodiments, a dimension of the undercut is no larger than one tenth a width of the middle portion.

According to one aspect, the substrate further includes a vertical stack of metal interconnect structures, where a penultimate metal layer in the vertical stack of metal interconnect structures includes the metal layer.

According to one aspect, the undercut includes a width of at least 2 um and a height of at least 2 um.

According to one aspect, the metal layer includes a metal trace that extends across at least a portion of the second surface.

Another example embodiment provides a device having a substrate including a first surface and an opposing second surface, a solder material receiving curved surface exposed at the second surface of the substrate, a solder resist material that at least partially covers the solder material receiving curved surface such that a middle portion of the solder receiving curved surface is exposed and such that an edge portion of the solder material receiving curved surface is covered by the solder resist material and forms an undercut, and a solder material disposed within the solder material receiving curved surface and within the undercut.

According to one aspect, the solder material is formed into a solder ball. In some embodiments, the device further includes an air gap provided between the solder ball and an adjacent circuit component that is electrically connected to the substrate. In some embodiments, the solder ball includes a diameter at least about ten times larger than a dimension of the undercut. In some embodiments, the adjacent circuit component includes at least one of a passive circuit component and an Integrated Circuit (IC) chip. In some embodiments, the solder material receiving curved surface includes a metal trace and the middle portion is substantially planar.

According to one aspect, a portion of the solder material that is disposed within the undercut forms a mushroom-shaped interlocking structure.

Another example embodiment provides an electronic device having a substrate, a cavity disposed in the substrate such that the substrate has a first top surface positioned above the cavity and a second top surface positioned within the cavity, an inner substrate wall surrounding the second top surface so as to define the cavity, and a substantially looped conductive trace disposed in the substrate such that an inner substantially looped portion of the substantially looped conductive trace is disposed on the second top surface and an outer substantially looped portion of the substantially looped conductive trace is enclosed within the substrate under the inner substrate wall.

According to one aspect, the substantially looped conductive trace completely surrounds an edge of the second top surface.

According to one aspect, the electronic device further includes a plurality of conductive vias disposed below the substantially looped conductive trace and forming a loop therein below the cavity within the substrate.

According to one aspect, the inner substrate wall has a toe portion positioned at a bottom portion of the inner substrate wall. In some embodiments, the toe portion is tapered towards the cavity.

According to one aspect, the substantially looped conductive trace has a rectangular shape and the inner substrate wall has four planar portions defining a cuboidal cavity.

According to one aspect, the substantially looped conductive trace has at least one gap preventing the substantially looped conductive trace from surrounding entirely an edge of the second top surface.

According to one aspect, the inner substantially looped portion and the outer substantially looped portion are coaxially aligned.

According to one aspect, the substantially looped conductive trace has a trace width, and the inner substantially looped portion has a width that is at least 50% of the trace width of the substantially looped conductive trace.

According to one aspect, the electronic device further includes a lower ring via electrically connecting the substantially looped conductive trace to a bottom surface of the substrate.

According to one aspect, the electronic device further includes an upper ring via electrically connecting the substantially looped conductive trace to the first top surface of the substrate.

According to one aspect, the electronic device further includes an integrated chip disposed within the cavity on the second top surface, where the integrated chip is distanced away from the substantially looped conductive trace.

According to one aspect, the electronic device further includes the second top surface of the substrate includes a substantially electrically insulation material adjacent to the substantially looped conductive trace.

Specific details were given in the description to provide a thorough understanding of example embodiments. However, it will be understood by one of ordinary skill in the art that example embodiments may be practiced without these specific details. In other instances, well-known circuits, processes, algorithms, structures, and techniques may be shown without unnecessary detail in order to avoid obscuring example embodiments.

While illustrative embodiments have been described in detail herein, it is to be understood that inventive concepts may be otherwise variously embodied and employed, and that the appended claims are intended to be construed to include such variations, except as limited by the prior art.

What is claimed is:

1. A substrate, comprising:
    a first surface;
    a second surface that opposes the first surface; and
    a metal layer that is exposed at the first surface, wherein the metal layer comprises:
        a curved surface configured to receive solder material, the curved surface having an edge portion that is partially covered by a solder resist material such that an undercut is formed between the solder resist material and the edge portion so as to trap a portion of the solder material within the undercut and on the edge portion of the curved surface at a location past an edge of the solder resist material.

2. The substrate of claim 1, wherein the curved surface further comprises a middle portion that is substantially planar.

3. The substrate of claim 2, wherein a dimension of the undercut is no larger than one tenth a width of the middle portion.

4. The substrate of claim 2, wherein the edge portion extends 2 um to 4 um from an outer perimeter of the middle portion.

5. The substrate of claim 1, further comprising:
    a vertical stack of metal interconnect structures, wherein a penultimate metal layer in the vertical stack of metal interconnect structures comprises the metal layer.

6. The substrate of claim 1, wherein the undercut comprises a width of at least 2 um and a height of at least 2 um.

7. The substrate of claim 1, wherein the undercut comprises a width in between 2 um and 6 um and a height between 2 um and 4 um.

8. The substrate of claim 1, wherein the undercut comprises a first width, the edge portion comprises a second width, and the first width is equal to the second width.

9. The substrate of claim 1, wherein the metal layer comprises a metal trace that extends across at least a portion of the first surface.

10. A device, comprising:
    a substrate comprising a first surface and an opposing second surface;
    a curved surface configured to receive solder material, the curved surface exposed at the first surface of the substrate;
    a solder resist material that at least partially covers the curved surface such that a middle portion of the solder receiving curved surface is exposed and such that an edge portion of the curved surface is covered by the solder resist material and forms an undercut; and
    wherein the solder material is disposed within the curved surface and within the undercut.

11. The device of claim 10, wherein the solder material is formed into a solder ball, the device further comprising:
    an air gap provided between the solder ball and an adjacent circuit component that is electrically connected to the substrate.

12. The device of claim 11, wherein the solder ball comprises a diameter at least about ten times larger than a dimension of the undercut.

13. The device of claim 11, wherein the adjacent circuit component comprises at least one of a passive circuit component and an Integrated Circuit (IC) chip, wherein the curved surface comprises a metal trace, and wherein the middle portion is substantially planar.

14. The device of claim 10, wherein a portion of the solder material that is disposed within the undercut forms a mushroom-shaped interlocking structure.

15. An electronic device, comprising:
    a cavity disposed in a substrate such that the substrate has a first top surface positioned above the cavity and a second top surface positioned within the cavity;
    an inner substrate wall surrounding the second top surface so as to define the cavity; and
    a substantially looped conductive trace disposed in the substrate such that an inner substantially looped portion of the substantially looped conductive trace is disposed on the second top surface and an outer substantially looped portion of the substantially looped conductive trace is enclosed within the substrate under the inner substrate wall.

16. The electronic device of claim 15, further comprising a curved surface configured to receive solder material, the curved surface having an edge portion that is partially covered by a solder resist material such that an undercut is formed between the solder resist material and the edge portion.

17. The electronic device of claim 16, wherein a portion of the solder material is disposed within the undercut to define a mushroom-shaped interlocking structure.

18. The electronic device of claim 16, wherein a width of the solder material is at least ten times larger than a dimension of the undercut.

19. The electronic device of claim 16, wherein the undercut comprises a first width, the edge portion comprises a second width, and the first width is equal to the second width.

20. The electronic device of claim 16, wherein the undercut comprises a width of at least 2 um and a height of at least 2 um.

* * * * *